(12) United States Patent
Pax

(10) Patent No.: US 10,410,950 B1
(45) Date of Patent: Sep. 10, 2019

(54) HEAT SPREADERS FOR USE WITH SEMICONDUCTOR DEVICES

(71) Applicant: Micron Technology, Inc., Boise, ID (US)

(72) Inventor: George E. Pax, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/977,760

(22) Filed: May 11, 2018

(51) Int. Cl.
*H01L 23/00* (2006.01)
*H01L 23/367* (2006.01)
*H01L 25/00* (2006.01)
*H01L 25/065* (2006.01)
*H01L 23/40* (2006.01)

(52) U.S. Cl.
CPC ...... *H01L 23/3677* (2013.01); *H01L 25/0657* (2013.01); *H01L 25/50* (2013.01); *H01L 2023/4068* (2013.01)

(58) Field of Classification Search
CPC ............................................ H01L 2225/06589
See application file for complete search history.

(56) References Cited

U.S. PATENT DOCUMENTS

| 2004/0145063 | A1* | 7/2004 | Sutherland | H01L 23/367 257/777 |
| 2009/0250249 | A1* | 10/2009 | Racz | B81C 1/00333 174/252 |
| 2012/0086135 | A1* | 4/2012 | Thompson | H01L 23/13 257/787 |
| 2015/0195952 | A1* | 7/2015 | Tsunoda | H05K 7/20163 361/697 |
| 2016/0043370 | A1* | 2/2016 | Hatta | H01M 2/145 307/10.1 |
| 2017/0003782 | A1* | 1/2017 | Heo | G06F 3/044 |
| 2017/0090532 | A1* | 3/2017 | Koukami | G06F 1/20 |
| 2018/0254236 | A1* | 9/2018 | Cola | H01L 23/3735 |

* cited by examiner

*Primary Examiner* — Thao P Le
(74) *Attorney, Agent, or Firm* — Perkins Coie LLP

(57) ABSTRACT

Memory devices having heat spreaders are disclosed herein. In one embodiment, a memory device includes first memories coupled to a front side of a substrate, second memories coupled to a back side of the substrate, and a flexible heat spreader. The flexible heat spreader can include graphite and is coupled to back side surfaces of the first and second memories to dissipate heat generated by the first and second memories.

12 Claims, 10 Drawing Sheets

HEAT SPREADERS FOR USE WITH SEMICONDUCTOR DEVICES

TECHNICAL FIELD

The present disclosure generally relates to heat spreaders for use with semiconductor devices, and more particularly relates to graphite heat spreaders for use with memory devices.

BACKGROUND

Memory packages or modules typically include multiple memory devices mounted on a substrate. Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others.

Improving memory packages, generally, may include increasing memory cell density, increasing read/write speeds or otherwise reducing operational latency, increasing reliability, increasing data retention, reducing power consumption, reducing manufacturing costs, and reducing the size or footprint of the memory packages and/or components of the memory devices, among other metrics. A challenge associated with improving memory packages is that improvements often result in increased heat generation—e.g., as a result of increasing memory device density, increasing the speed or processing ability of the memory devices, etc. Without sufficient cooling, the additional heating can cause the memory devices to reach temperatures above their maximum operating temperatures ($T_{max}$).

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
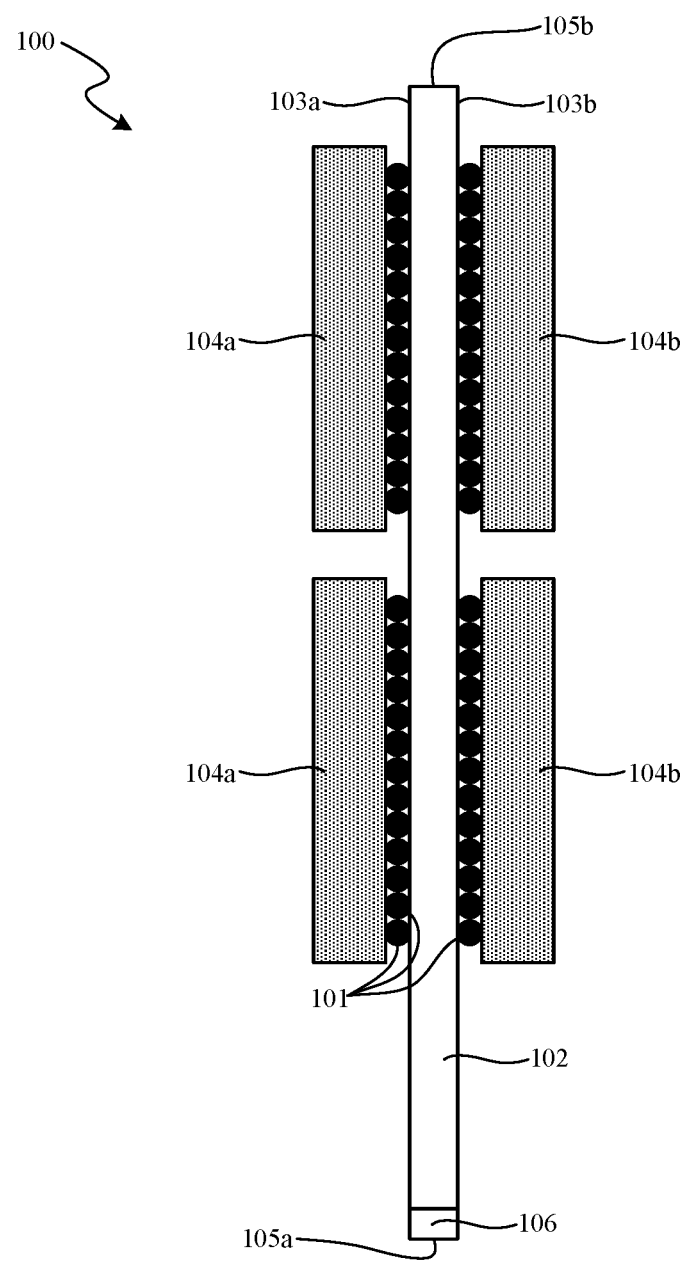
FIGS. 1A-1C are side, front, and back views, respectively, of a memory device 100 configured in accordance with an embodiment of the present technology.

Specific details of several embodiments of memory devices having heat spreaders, and associated systems and methods, are described below with reference to FIGS. 1-7. In several of the embodiments, a memory device is a dual in-line memory module (DIMM) having a substrate and a plurality of memories electrically coupled to the substrate. The memories can include first and second memories arranged in rows on a front side and a back side of the substrate, respectively. A flexible heat spreader is coupled to the first memories, the second memories, or both the first and second memories. In some embodiments, the heat spreader includes a graphite member enveloped in a plastic covering. The heat spreader advantageously reduces the operating temperature of the memories by spreading heat away from at least some of the memories (e.g., memories that because of their location on the substrate are more likely to have an increased operating temperature).

Numerous specific details are discussed to provide a thorough and enabling description of embodiments of the present technology. A person skilled in the art, however, will understand that the technology may have additional embodiments and that the technology may be practiced without several of the details of the embodiments described below with reference to FIGS. 1-7. In other instances, well-known structures or operations often associated with memory devices are not shown, or are not described in detail, to avoid obscuring other aspects of the technology. In general, it should be understood that various other devices and systems in addition to those specific embodiments disclosed herein may be within the scope of the present technology. For example, in the illustrated embodiments below, the memory devices and systems are primarily described in the context of DIMMs compatible with DRAM and flash (e.g., NAND and/or NOR) storage media. Memory devices and systems configured in accordance with other embodiments of the present technology, however, can include memory modules compatible with other types of storage media, including PCM, RRAM, MRAM, read only memory (ROM), erasable programmable ROM (EPROM), electrically erasable programmable ROM (EEROM), ferroelectric, magnetoresistive, and other storage media, including static random-access memory (SRAM). Additionally, at least some of the heat spreaders described herein may be useful in semiconductor packages other than memory packages.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/ below, up/down, and left/right can be interchanged depending on the orientation.

Figure 1B:
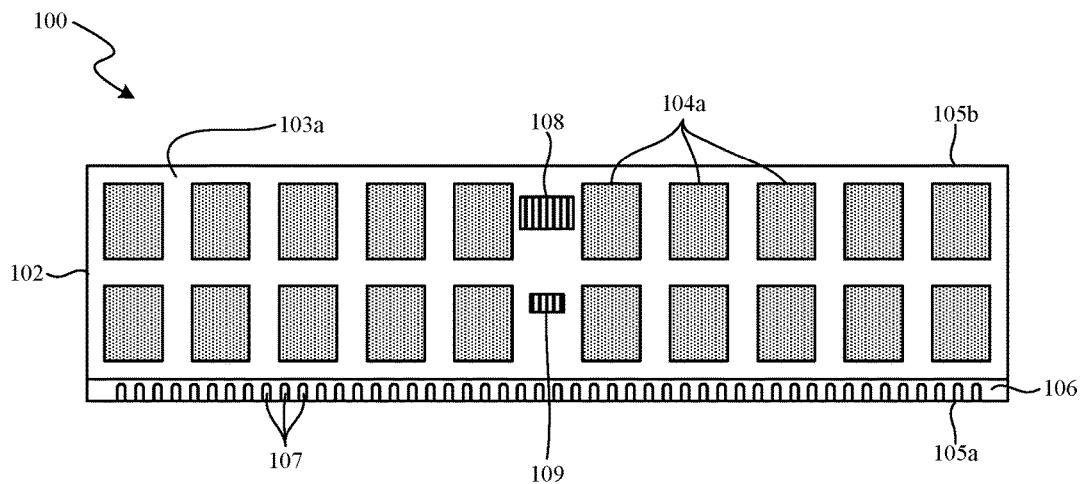
Figure 1C:
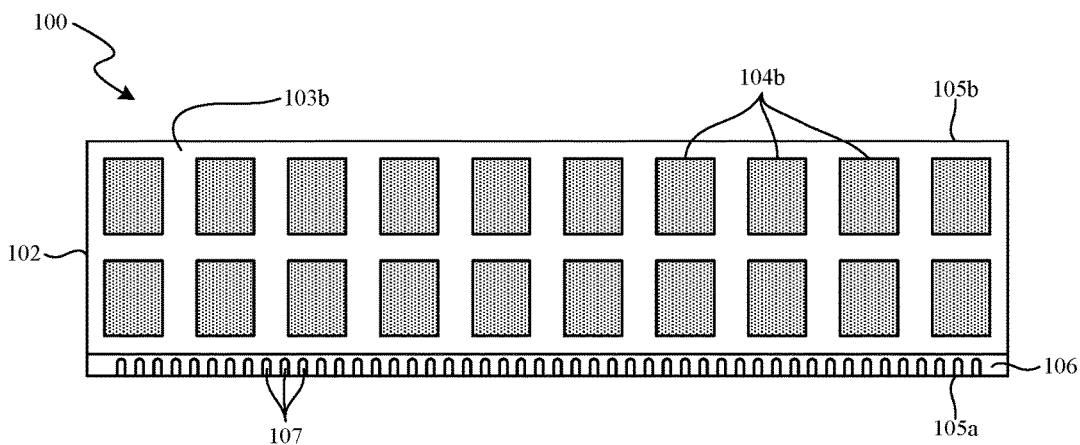

FIGS. 1A-1C are side, front, and back views, respectively, of a memory device 100 configured in accordance with an embodiment of the present technology. Referring to FIGS. 1A-1C together, the memory device 100 can be a memory module, such as a dual in-line memory module (DIMM) including a substrate (e.g., a printed circuit board (PCB) or the like) 102 having a front side 103a and an opposing back side 103b. A plurality of first memories 104a are coupled to the first side 103a, and a plurality of second memories 104b are coupled to the second side 103b. The first and second memories 104a and 104b are coupled to the respective sides of the substrate 102 via electrical connectors (e.g., solder balls) 101. In general, the memories 104a, b can include one or more (e.g., multiple stacked) semiconductor dies each including integrated memory circuitry and/or logic circuitry, which can include various types of semiconductor components and functional features, such as dynamic random-access memory (DRAM), static random-access memory (SRAM), flash memory, other forms of integrated circuit memory, processing circuits, and/or other semiconductor features. In some embodiments, the memories 104a, b can be DRAM memories (e.g., DRAM memory dies, DRAM memory chips, DRAM memory packages, or the like). In some embodiments, the memories 104a, b can be identical (e.g., DRAM memory packages manufactured to have the same design and specifications), while in other embodiments the memories 104a, b can be different from each other (e.g., including different types of memory dies or different combinations of controller, logic, and/or memory dies).

The memory device 100 further includes an edge connector 106 along a lower edge 105a (opposite an upper edge 105b) of the substrate 102. The edge connector 106 includes a plurality of contacts 107 for connecting the memories 104a, b to external circuitry (not shown). In some embodiments, for example, the edge connector 106 can be used to releasably secure the memory device 100 in a corresponding DIMM slot in a host device (e.g., a motherboard). More particularly, the edge connector 106 can connect a command/address bus and/or a data bus of the memory device 100 to the host device for, for example, receiving and/or transmitting data signals to/from the connected host device during memory access operations.

Referring to FIGS. 1B and 1C, the memories 104a, b are arranged in rows on the sides 103a, b of the substrate 102, respectively. In other embodiments, the memories 104a, b can be arranged differently and/or can comprise a different number. For example, more or fewer than the illustrated twenty first memories 104a and twenty second memories 104b (e.g., twenty-two, eighteen, sixteen, etc.) can be arranged in any number of rows and/or columns, or be generally unaligned, etc. In some embodiments, the memory device 100 can include other electrical components (e.g., semiconductor components, integrated circuit components, etc.) coupled to the substrate 102. In the illustrated embodiment, for example, the memory device 100 includes a voltage regulator or power management integrated circuit (PMIC) 108 and a registering clock driver (RCD) 109 coupled to the front side 103a of the substrate 102. The PMIC 108 can include one or more voltage regulators to convert a supply voltage to one or more output voltages (e.g., VDD, VDDQ, VPP, VSS, VSSQ, etc.) for use by one or more of the memories 104a, b. The RCD 109 can receive command/address signals from a command/address bus and generate memory command/address signals for the memories 104a, b. Although illustrated as coupled to the front side 103a of the substrate 102, in other embodiments, the PMIC 108, the RCD 109, and/or other electrical components can be coupled to the back side 103b of the substrate 102. In some embodiments, the other electrical components coupled to the substrate 102, such as the PMIC 108 and the RCD 109, can have higher maximum operating temperatures than the memories 104a, b. For example, in some embodiments, a difference between the maximum operating temperature of the memories 104a, b and the PMIC 108 and/or the RCD 109 can be 30° C. or greater.

Figure 2A:
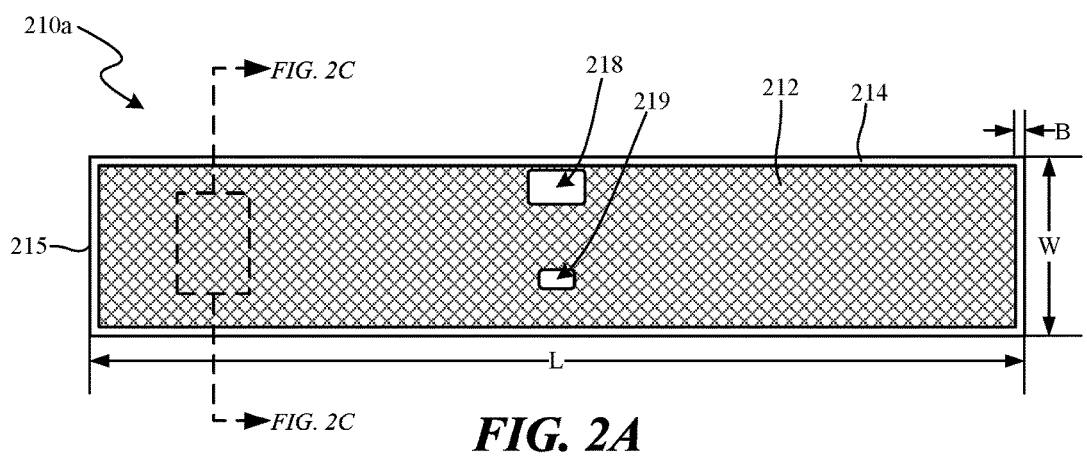
FIG. 2A is a front view of a first heat spreader for use with the memory device of FIGS. 1A-1C configured in accordance with an embodiment of the present technology.
Figure 2B:
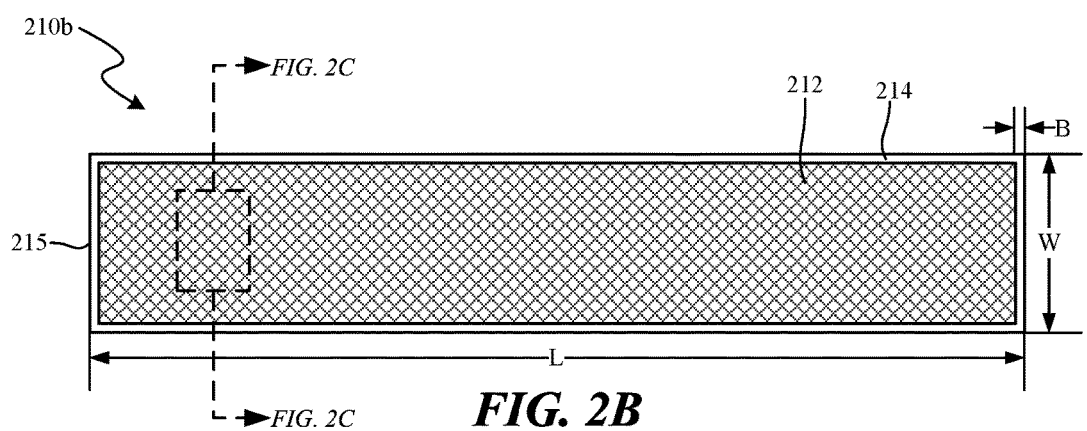
FIG. 2B is a front view of a second heat spreader for use with the memory device of FIGS. 1A-1C configured in accordance with an embodiment of the present technology.
Figure 2C:
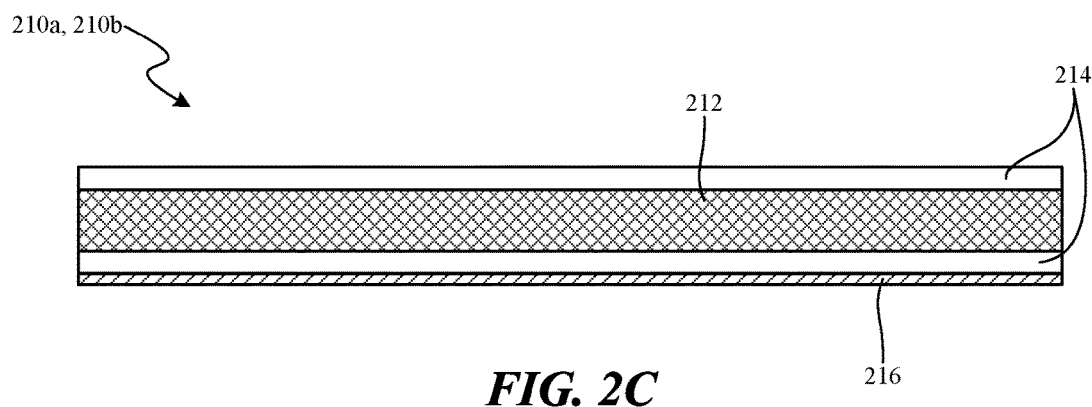
FIG. 2C is a side cross-sectional view of a portion of either of the heat spreaders of FIGS. 2A and 2B configured in accordance with an embodiment of the present technology.

FIGS. 2A and 2B are front views of a first heat spreader 210a and a second heat spreader 210b, respectively, for use with the memory device 100 shown in FIGS. 1A-1C and configured in accordance with embodiments of the present technology. FIG. 2C is a side cross-sectional view of a portion of either of the heat spreaders 210a, b configured in accordance with an embodiment of the present technology. The heat spreaders 210a, b can be generally similar to each other and, in some embodiments, identical. Referring to FIGS. 2A-2C together, the heat spreaders 210a, b each include a thermally conductive member 212 sealed (e.g., laminated, enveloped, etc.) within a plastic covering 214. A top layer (FIG. 2C) of the plastic covering 214 is not shown in FIGS. 2A and 2B for the sake of clarity. In some embodiments, the thermally conductive members 212 comprise graphite and the plastic covering 214 comprises a thermoplastic material such as polyethylene terephthalate (PET). In other embodiments, the thermally conductive members 212 can comprise other thermally conductive materials such as, for example, nickel (Ni), copper (Cu), aluminum (Al), ceramic materials with high thermal conductivities (e.g., aluminum nitride), or combinations thereof. In still other embodiments, the plastic covering 214 may comprise other suitable materials such as, for example, polyethylene (PR), polypropylene (PP), etc. In these and other embodiments, the heat spreaders 210a, b may be generally flexible.

In the illustrated embodiment, the heat spreaders 210a, b each have a generally rectangular planform shape while, in other embodiments, the heat spreaders 210a, b can have other suitable shapes (e.g., circular, oval, square, rectilinear, polygonal, etc.). In some embodiments, the heat spreaders 210a, b can each have a length L of between about 120-130 mm (e.g., about 126 mm) and a width W of between about 20-30 mm (e.g., about 23 mm). The conductive members 212 occupy substantially all of the area of the heat spreaders 210a, b—for example, the entire area apart from a border or sealing region of the plastic coverings 214 that is directly adjacent to an edge (e.g., perimeter) 215 of the heat spreaders 210a, b. In some embodiments the sealing region of the plastic covering 214 can have a width B of between about 1-5 mm (e.g., between about 1-3 mm).

Referring to FIG. 2A, the conductive member 212 of the first heat spreader 210a can include a first aperture (e.g., opening, hole, cut-out, etc.) 218 and a second aperture 219 formed therein. In other embodiments, the first and second apertures 218 and 219 can be formed to extend through the entire thickness of the first heat spreader 210a (e.g., through the conductive member 212 and the plastic covering 214). In a particular embodiment, the first aperture 218 can have a generally rectangular planform shape with a length of about 15 mm and a width of about 10 mm, and the second aperture 219 can have a generally rectangular planform shape with a length of about 10 mm and a width of about 5 mm. In other embodiments, the first and second apertures 218,219 can have other planform shapes (e.g., circular, oval, square, rectilinear, polygonal, etc.) and/or can have different dimensions. Likewise, in some embodiments, the heat spreaders 210a, b can include more or fewer than the two illustrated apertures.

As illustrated in FIG. 2C, the heat spreaders 210a, b can each include an adhesive (e.g., an adhesive layer) 216 on one side thereof for, for example, adhering the heat spreaders 210a, b to the memory device 100, as described in detail below. In some embodiments, the adhesive 216 can be an acrylic or PET film adhesive with high thermal conductivity. In certain embodiments, the adhesive 216 can be formed from another suitable thermal interface material (TIM) that is designed to increase the thermal contact conductance at the surface junction between the memory device 100 and the heat spreaders 210a, b. For example, the adhesive 216 can be an adhesive that is doped with thermally conductive materials (e.g., carbon nano-tubes, solder materials, diamond-like carbon (DLC), etc.).

Figure 3A:
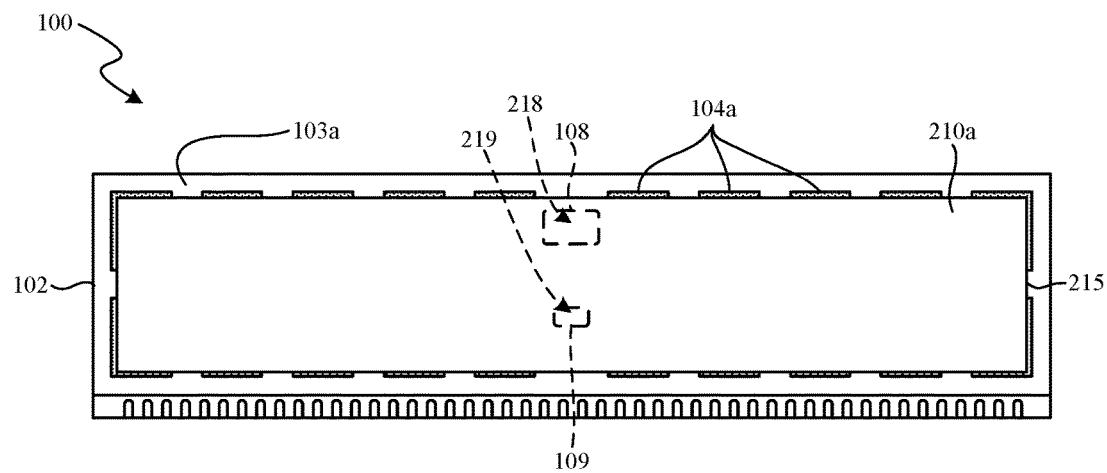
FIGS. 3A-3C are front, back, and side views, respectively, of the heat spreaders of FIGS. 2A and 2B coupled to the memory device of FIGS. 1A-1C in accordance with an embodiment of the present technology.
Figure 3B:
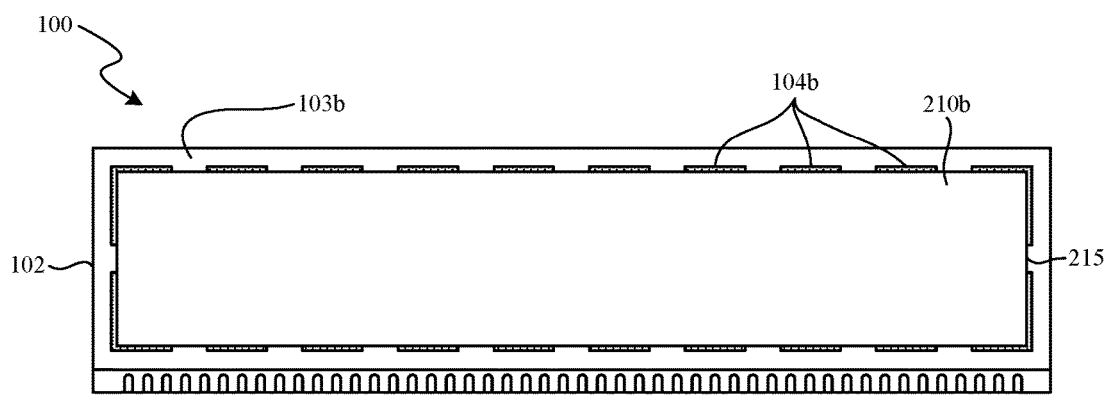
Figure 3C:
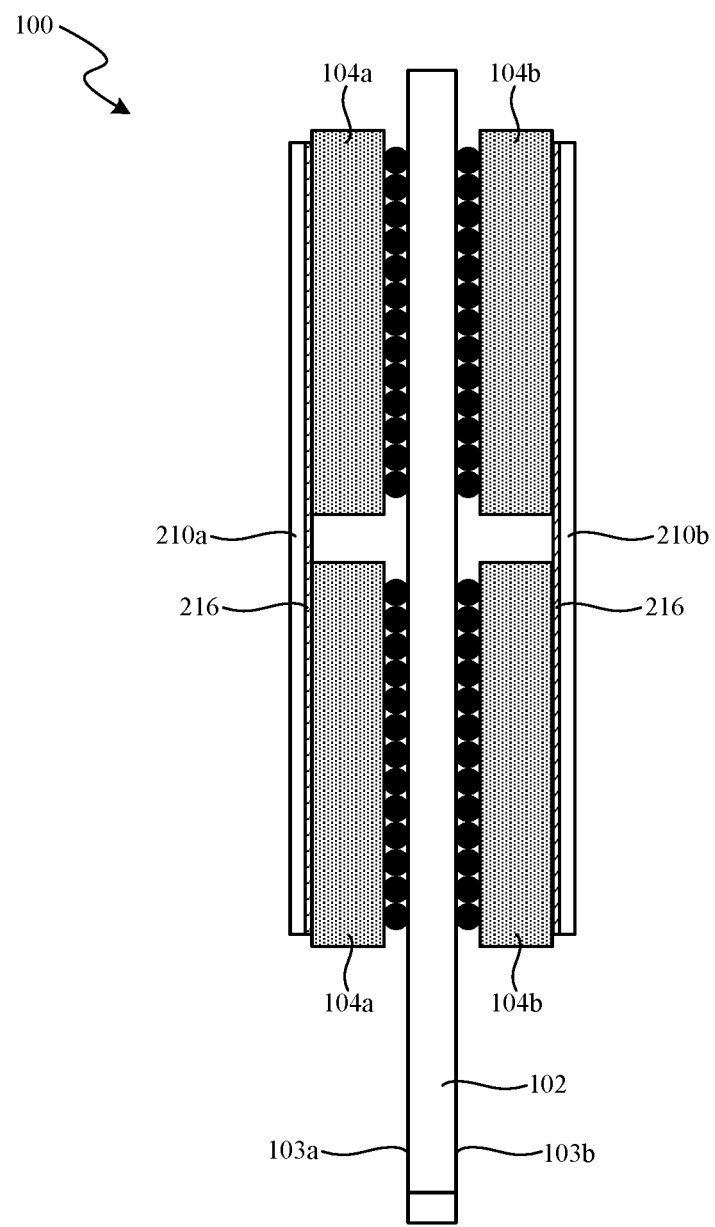

FIGS. 3A-3C are front, back, and side views, respectively, showing the heat spreaders 210a, b coupled to the memory device 100 in accordance with embodiments of the present technology. Referring to FIGS. 3A-3C together, the first heat spreader 210a is coupled to the first memories 104a on the front side 103a of the substrate 102 via the adhesive 216, and the second heat spreader 210b is coupled to the second memories 104b on the second side 103b of the substrate 102 via the adhesive 216. In the illustrated embodiment, the heat spreaders 210a, b cover substantially all of a back side surface of each of the memories 104a, b, respectively. Accordingly, because the conductive members 212 (FIGS. 2A-2C) occupy substantially all of the area of the heat spreaders 210a, b, the conductive members 212 can cover (e.g., be thermally coupled to, positioned over, etc.) substantially the entire back side surface of each of the memories 104a, b.

In this manner, the conductive members 212 of the heat spreaders 210a, b are positioned to absorb and dissipate thermal energy away from the memories 104a, b. In particular, the heat spreaders 210a, b can advantageously spread the heat away from certain ones of the memories 104a, b that would otherwise be operating at a higher temperature (e.g., those memories that are "downstream" of an air flow path within a host device incorporating the memory device 100). Thus, the heat spreaders 210a, b can reduce the likelihood that any single one of the memories 104a, b exceeds its maximum operating temperature ($T_{max}$).

In the illustrated embodiment, the edges 215 of the heat spreaders 210a, b are positioned within an outer perimeter defined by the memories 104a, b, respectively. That is, the edges 215 of the heat spreaders 210a, b are positioned on—and do not overhang—the back side surfaces of the memories 104a, b. This arrangement can inhibit the heat spreaders 210a, b from peeling away from the memories 104a, b and thereby weakening the thermal coupling between the heat spreaders 210a, b and the memories 104a, b—especially when the memory device 100 is configured for installation or handling by an end user. In other embodiments, the heat spreaders 210a, b can cover more or less of the back side surfaces of the memories 104a, b. In some embodiments, for example, the heat spreaders 210a, b can (i) only partially cover the back side surfaces of the memories 104a, b, (ii) cover only some (e.g., a subset) of the memories 104a, b, (iii) entirely cover and overhang the back side surfaces of the memories 104a, b, etc. Similarly, in some embodiments, the memory device 100 can include only the first heat spreader 210a or only the second heat spreader 210b, or could have more than two heat spreaders.

Referring to FIG. 3A, the first and second apertures 218, 219 (obscured in FIG. 3A; shown in dashed lines) can be generally aligned over the PMIC 108 and the RCD 109 (obscured in FIG. 3A; shown in dashed lines), respectively, to inhibit thermal paths from the PMIC 108 and the RCD 109 into the conductive member 212 of the first heat spreader 210a. More particularly, the first and second apertures 218, 219 do not conduct heat as well as the conductive member 212 of the first heat spreader 210a, and therefore inhibit the heat from the PMIC 108 and the RCD 109 from entering the conductive member 212 and increasing the temperature of the first memories 104a. As described in detail above, the maximum operating temperature of the PMIC 108 and the RCD 109 can be higher than that of the memories 104a, b. Thus, heat dissipation away from the PMIC 108 and RCD 109 may be less important as compared to the more sensitive memories 104a, b. In other embodiments, the heat spreaders 210a, b can have more or fewer apertures arranged over various circuit components coupled to the substrate 102. Moreover, in some embodiments, the conductive members 212 of the heat spreaders 210a, b can be positioned over and thermally coupled to other circuit components in addition to the memories 104a, b—for example, circuit components that have a relatively low maximum operating temperature ($T_{max}$) and that would therefore benefit from heat dissipation.

Although described above in terms of separate first and second heat spreaders 210a, b, in some embodiments, for ease of reference, the heat spreaders 210a, b can be referred to as a single heat spreader (e.g., for use with the single memory device 100) that has, for example, separate first and second portions.

Figure 4:
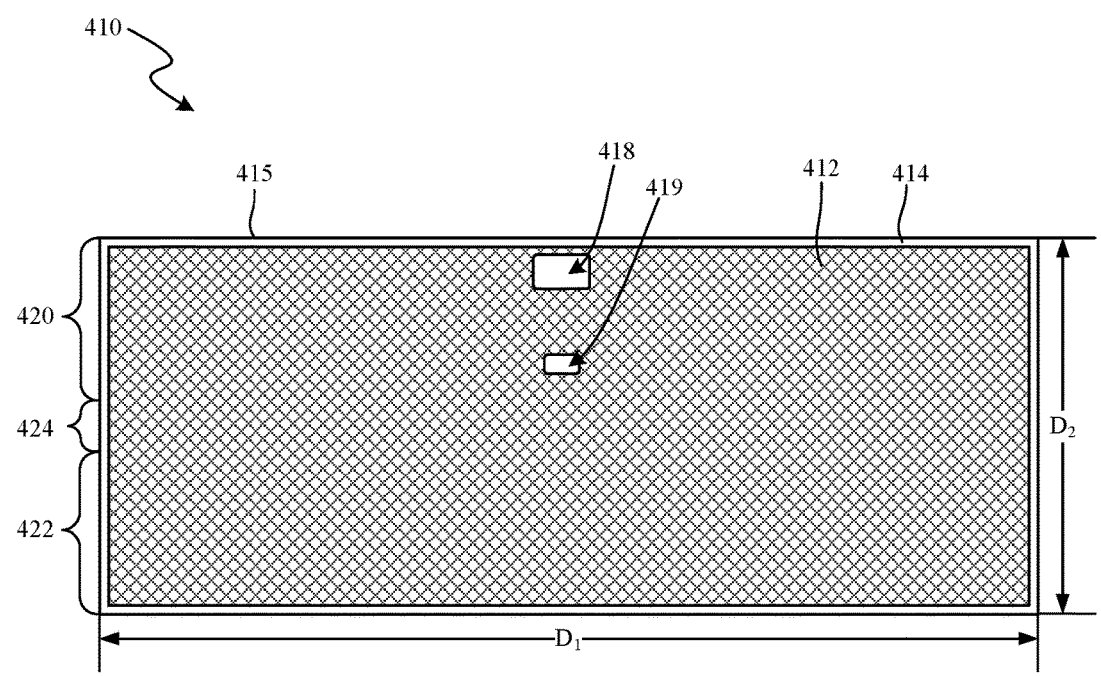
FIG. 4 is a front view of a heat spreader for use with the memory device of FIGS. 1A-1C configured in accordance with another embodiment of the present technology.

FIG. 4 is a front view of a heat spreader 410 for use with the memory device 100 shown in FIGS. 1A-1C configured in accordance with another embodiment of the present technology. The heat spreader 410 can include features generally similar to those of the heat spreaders 210a, b described in detail above. For example, the heat spreader 410 can be generally flexible and can include a thermally conductive (e.g., graphite) member 412 sealed within a plastic covering 414. The top layer of the plastic covering 414 is not shown in FIG. 4 for the sake of clarity.

In the illustrated embodiment, the heat spreader 410 has a generally rectangular shape with a first edge dimension $D_1$ (e.g., a length) and a second edge dimension $D_2$ (e.g., a width). In some embodiments, the first edge dimension $D_1$ is between about 120-130 mm (e.g., about 126 mm) and the second edge dimension $D_2$ is between about 45-55 mm (e.g., about 51 mm). The heat spreader 410 can further include a first portion 420, a second portion 422, and a third portion 424 between the first and second portions 420, 422. In some embodiments, the conductive member 412 can be only partially positioned within the third portion 424 (e.g., have one or more cutouts in the third portion 424), or can be separated into two portions that are only positioned within the first and second portions 420, 422. In some embodiments, one or more apertures (e.g., a first aperture 418 and a second aperture 419) are formed in the conductive member 412 at the first portion 420. The apertures can generally be formed so as to align over various circuit components of the memory device 100 when the heat spreader 410 is coupled to the memory device 100, as described in detail below. As shown, the conductive member 412 occupies substantially all of the area of the heat spreader 410 apart from a border or sealing region of the plastic covering 414 that is directly adjacent to an edge 415 of the heat spreader 410.

Figure 5A:
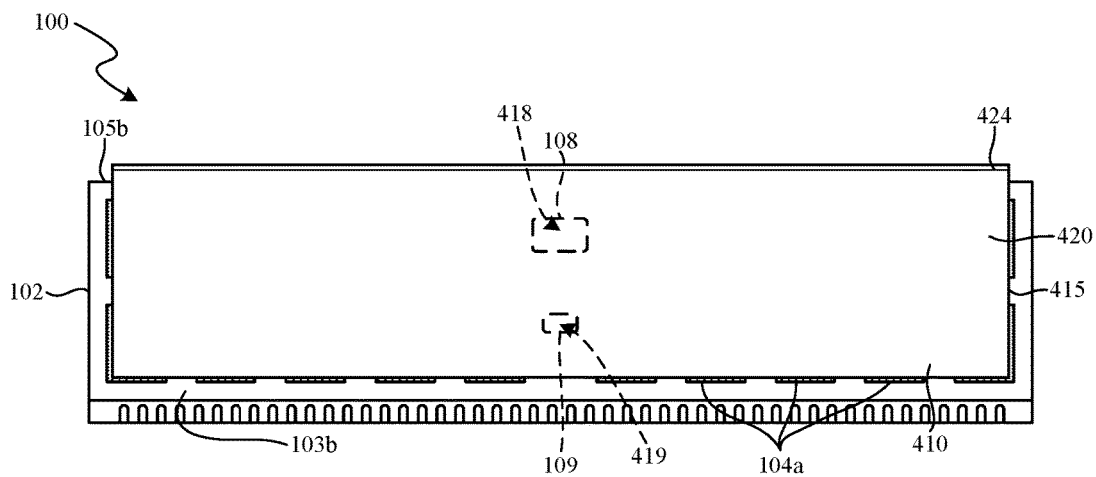
FIGS. 5A-5C are front, back, and side views, respectively, of the heat spreader of FIG. 4 coupled to the memory device of FIGS. 1A-1C in accordance with an embodiment of the present technology.
Figure 5B:
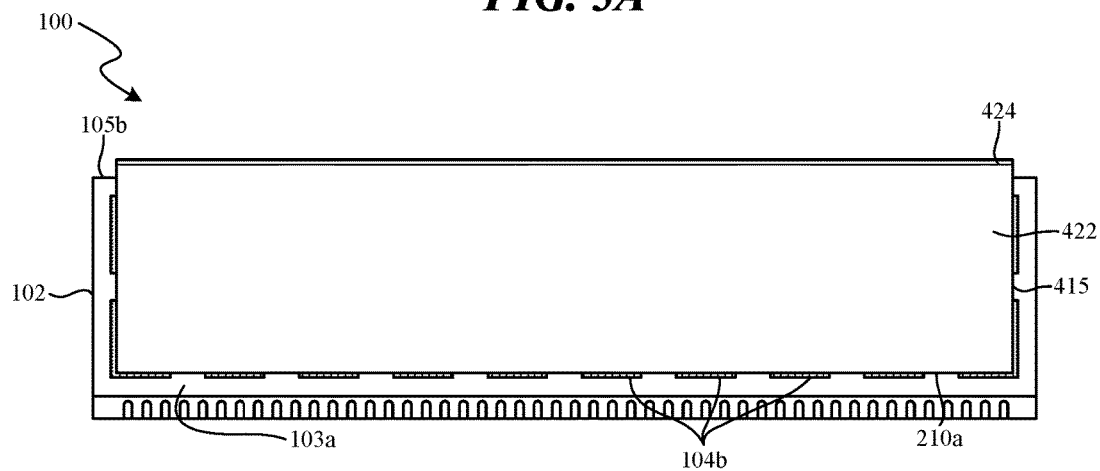
Figure 5C:
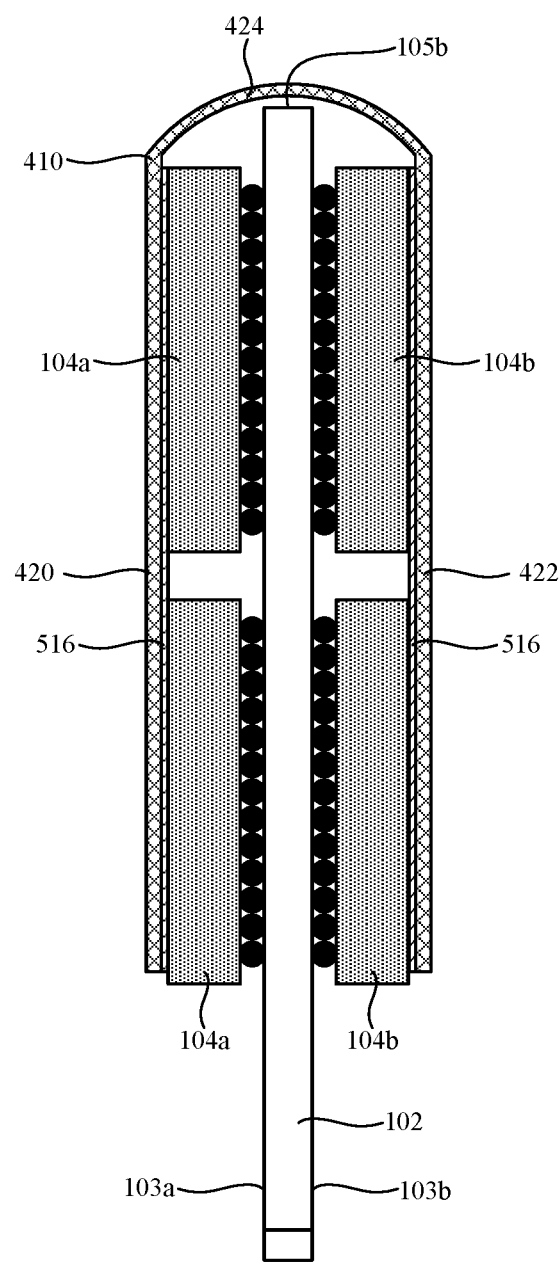

FIGS. 5A-5C are front, back, and side views of the heat spreader 410 coupled to the memory device 100 in accordance with embodiments of the present technology. Referring to FIGS. 5A-5C together, the heat spreader 410 is coupled to the memories 104a, b and wraps around the upper edge 105b of the substrate 102. More particularly, (i) the first portion 420 of the heat spreader 410 is generally planar and coupled to the first memories 104a on the front side 103a of the substrate 102 via an adhesive 516 (FIG. 5C), (ii) the second portion 422 of the heat spreader 410 is generally planar and coupled to the second memories 104b on the second side 103b of the substrate 102 via the adhesive 516, and (iii) the third portion 424 of the heat spreader 410 is generally curved and extends around the upper edge 105b of the substrate 102. Referring to FIG. 5A, the apertures 418, 419 (obscured in FIG. 5A; shown in dashed lines) can be generally aligned over the PMIC 108 and the RCD 109 (obscured in FIG. 5A; shown in dashed lines), respectively, to inhibit thermal paths between the conductive member 412 of the heat spreader 410 and the PMIC 108 and RCD 109.

In the illustrated embodiment, the heat spreader 410 covers substantially all of a back side surface of each of the memories 104a, b to absorb and dissipate thermal energy away from the memories 104a, b. As compared to, for example, the embodiment illustrated in FIGS. 2A-3C, the heat spreader 410 can have a relatively greater heat dissipating area because the conductive member 412 is positioned in the third portion 424 of the heat spreader 410. That is, for example, the heat spreader 410 can include relatively more graphite. Moreover, because the heat spreader 410 wraps around the upper edge 105b of the substrate 102, the heat spreader has relatively fewer edges that could cause peeling or other weakening of the thermal coupling between the heat spreader 410 and the memories 104a, b. In particular, the heat spreader 410 does not include an upper edge that must be adhered to the uppermost memories 104a, b and that may be sensitive to peeling during, for example, installation of the memory device 100 by an end user.

Figure 6A:
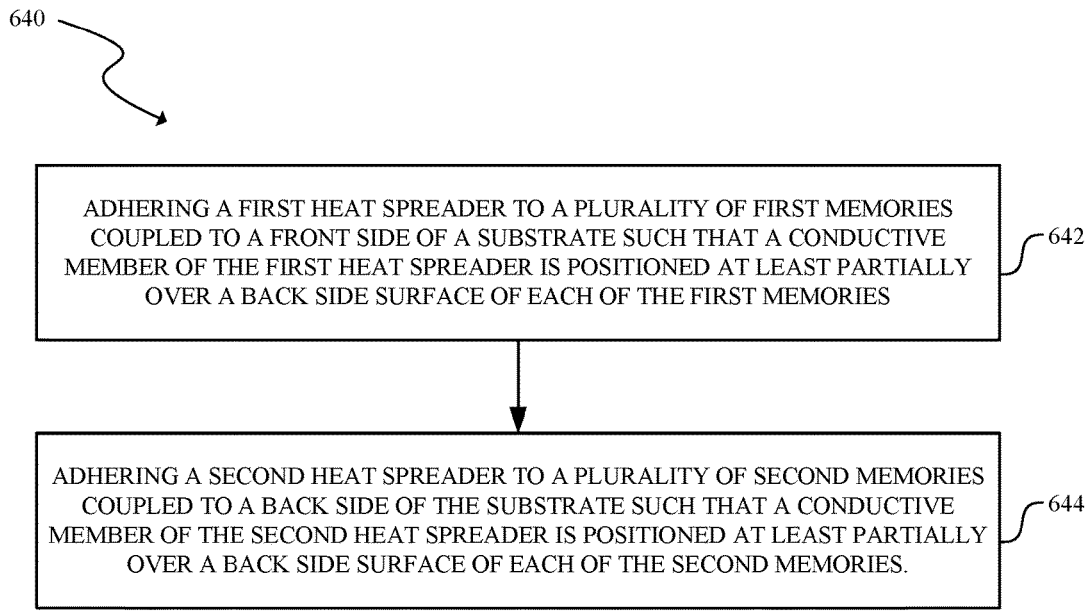
FIG. 6A is a flow diagram of a process or method for coupling the heat spreader of FIGS. 2A-3C to the memory device of FIGS. 1A-1C configured in accordance with an embodiment of the present technology.

The heat spreaders of the present technology can be coupled to the memory device 100 either manually or automatically as part of an automated manufacturing process. For example, FIG. 6A is a flow diagram of a process or method 640 for coupling the heat spreaders 210a, b (FIGS. 2A-3C) to the memory device 100 in accordance with an embodiment of the present technology. Beginning at block 642, the method 640 includes adhering (e.g., via the adhesive 216) the first heat spreader 210a to the first memories 104a such that the thermally conductive member 212 of the first heat spreader 210a is positioned at least partially over the back side surface of each of the first memories 104a (e.g., as shown in FIG. 3A.) At block 644, the method 640 includes adhering the second heat spreader 210b to the second memories 104b such that the thermally conductive member 212 of the second heat spreader 210b is positioned at least partially over the back side surface of each of the second memories 104b (e.g., as shown in FIG. 3B). In some embodiments, for example, the heat spreaders 210a, b can be pressed against the memories 104a, b to adhere them thereto. In some embodiments, the adhesive 216 can be formed on the back side surfaces of the memories 104a, b prior to pressing the plastic coverings 214 of the heat spreaders 210a, b against the memories 104a, b. In some embodiments, a release layer can be formed on the adhesive 216 to protect the adhesive 216 prior to installation of the heat spreaders 210a, b.

Figure 6B:
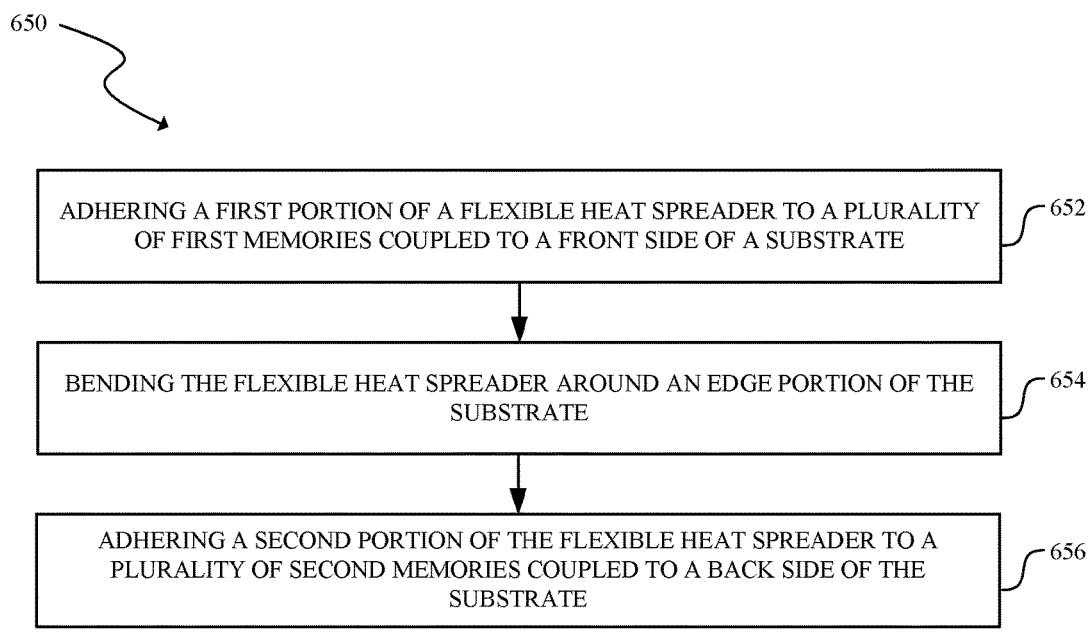
FIG. 6B is a flow diagram of a process or method for coupling the heat spreader of FIGS. 4-5C to the memory device of FIGS. 1A-1C configured in accordance with an embodiment of the present technology.

FIG. 6B is a flow diagram of a process or method 650 for coupling the heat spreader 410b (FIGS. 4-5C) to the memory device 100 in accordance with an embodiment of the present technology. Beginning at block 652, the method 650 includes adhering the first portion 420 of the heat spreader 410 against the back side surfaces of the first memories 104a. At block 654, the third portion 424 of the heat spreader 410 is flexed or curved around the upper edge 105b of the substrate 102. At block 656, the second portion 422 of the heat spreader 410 is adhered to the back side surfaces of the second memories 104b. In some embodiments, the adhesive 516 may be first formed on the back side surfaces of the memories 104a, b and/or on the heat spreader 410 and the heat spreader 410 pressed against the memories 104a, b to adhere it thereto. In other embodiments, the heat spreader 410 could be partially or fully bent before pressing the first and second portions 420, 422 against the memories 104a, b.

In addition to dissipating heat from the memories 104a, b, the heat spreaders described herein can also act as a cover or shield to protect the components of the memory device 100 from damage as a result of incidental contact. Moreover, in some embodiments, the heat spreaders can have descriptive labels printed thereon that, for example, list details or specifications of the memory device 100.

Figure 7:
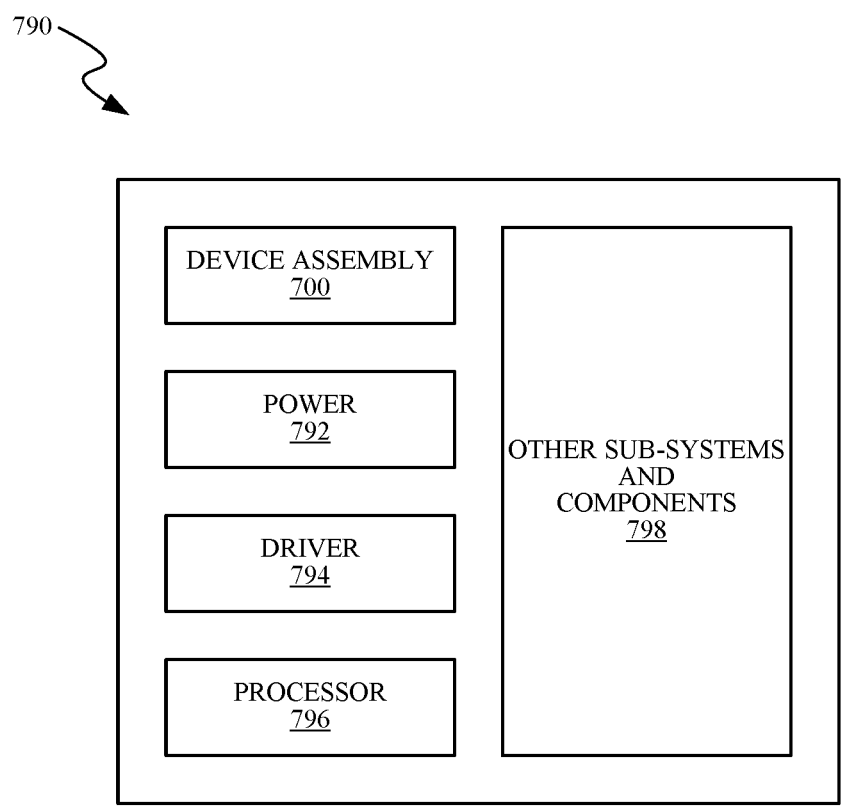
FIG. 7 is a schematic view of a system that includes a memory device configured in accordance with embodiments of the present technology.

FIG. 7 is a schematic view a system that includes a memory device configured in accordance with embodiments of the present technology. Any one of the foregoing memory devices described above with reference to FIGS. 1-6B can be incorporated into any of a myriad of larger and/or more complex systems, a representative example of which is system 790 shown schematically in FIG. 7. The system 790 can include a memory device assembly 700, a power source 792, a driver 794, a processor 796, and/or other subsystems and components 798. The memory device assembly 700 can include features generally similar to those of the memory devices described above with reference to FIGS. 1-6B, and can, therefore, include graphite heat spreaders having various configurations. The resulting system 790 can perform any of a wide variety of functions, such as memory storage, data processing, and/or other suitable functions. Accordingly, representative systems 790 can include, without limitation, hand-held devices (e.g., mobile phones, tablets, digital readers, and digital audio players), computers (e.g., workstations, servers, etc.), vehicles, appliances, and other products. Components of the system 790 may be housed in a single unit or distributed over multiple, interconnected units (e.g., through a communications network). The components of the system 790 can also include remote devices and any of a wide variety of computer readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

I claim:

1. A heat spreader for use with a dual in-line memory module (DIMM), the heat spreader comprising:
   a graphite member; and a plastic covering enveloping the graphite member,
wherein the heat spreader is configured to be coupled to at least one of
a plurality of first memories electrically coupled to and arranged in one or more rows at a front side of a substrate of the DIMM, and
a plurality of second memories electrically coupled to and arranged in one or more rows at a back side of the substrate of the DIMM, and
wherein the graphite member includes
a first opening configured to be generally positioned over a first circuit component attached to the front side of the substrate of the DIMM, wherein the first opening is configured to inhibit a thermal path through the graphite member between the first circuit component and the first memories, and
a second opening configured to be generally positioned over a second circuit component attached to the front side of the substrate of the DIMM, wherein the second opening is configured to inhibit a thermal path through the graphite member between the second circuit component and the first memories.

2. The heat spreader of claim 1, wherein the first circuit component is a power management integrated circuit (PMIC).

3. The heat spreader of claim 1, wherein the second circuit component is a registering clock driver (RCD).

4. The heat spreader of claim 1, wherein:
the first circuit component is a PMIC,
the second circuit component is a RCD,
the first opening has a first cross-sectional dimension, and
the second opening has a second cross-sectional dimension, less than the first cross-sectional dimension.

5. The heat spreader of claim 1 wherein the plastic covering includes a thermoplastic material.

6. The heat spreader of claim 5 wherein the thermoplastic material is polyethylene terephthalate.

7. The heat spreader of claim 1, wherein the first circuit component is a voltage regulator.

8. The heat spreader of claim 1 wherein the first opening has a generally rectangular shape having a length of about 15 mm and a width of about 10 mm.

9. The heat spreader of claim 1 wherein the heat spreader is flexible, and wherein the heat spreader is configured to be attached to both the first and second memories such that it curves around an edge of the substrate.

10. The heat spreader of claim 9 wherein the heat spreader has a first length along a first edge of between about 120-130 mm, and a second length along a second edge of between about 45-55 mm, wherein the first edge is generally perpendicular to the second edge.

11. The heat spreader of claim 1 wherein
the graphite member is of a first heat spreader portion,
the first heat spreader portion is configured to be attached to substantially an entire back side of each of the first memories,
the heat spreader further comprises a graphite member of a second heat spreader portion, and
the second heat spreader portion is configured to be attached to substantially an entire back side of each of the second memories.

12. The heat spreader of claim 11 wherein the first and second heat spreader portions each have a rectangular shape with a length of between about 120-130 mm and a width of between about 20-30 mm.

* * * * *